(12) United States Patent
Stopka et al.

(10) Patent No.: US 12,057,287 B2
(45) Date of Patent: Aug. 6, 2024

(54) METHODS AND SYSTEMS FOR ALIGNING A MULTI-BEAM SYSTEM

(71) Applicant: FEI Company, Hillsboro, OR (US)

(72) Inventors: Jan Stopka, Brno (CZ); Bohuslav Sed'A, Brno (CZ); Radovan Vašina, Brno (CZ); Radim Šejnoha, Brno (CZ)

(*) Notice: Subject to any disclaimer, the term of this patent is extended or adjusted under 35 U.S.C. 154(b) by 321 days.

(21) Appl. No.: 17/709,025

(22) Filed: Mar. 30, 2022

(65) Prior Publication Data
US 2023/0317405 A1    Oct. 5, 2023

(51) Int. Cl.
| | |
|---|---|
| *H01J 37/153* | (2006.01) |
| *G06T 7/70* | (2017.01) |
| *H01J 37/244* | (2006.01) |
| *H01J 37/28* | (2006.01) |

(52) U.S. Cl.
CPC ............. *H01J 37/153* (2013.01); *G06T 7/70* (2017.01); *H01J 37/244* (2013.01); *H01J 37/28* (2013.01); *H01J 2237/1534* (2013.01)

(58) Field of Classification Search
CPC .. H01J 37/00; H01J 37/02; H01J 37/26; H01J 37/28; H01J 37/153; H01J 37/244; H01J 37/222; H01J 2237/1534; H01J 2237/1501; H01J 2237/2826; G06T 7/70
USPC ............................................. 250/306, 307, 311
See application file for complete search history.

(56) References Cited

U.S. PATENT DOCUMENTS

| | | |
|---|---|---|
| 10,338,013 B1 | 7/2019 | Brodie et al. |
| 2003/0209676 A1 | 11/2003 | Loschner et al. |
| 2005/0006601 A1 | 1/2005 | Muraki et al. |
| 2005/0211921 A1* | 9/2005 | Wieland ................ B82Y 40/00 250/492.2 |
| 2013/0320230 A1 | 12/2013 | Yoshikawa et al. |
| 2020/0027689 A1* | 1/2020 | Breuer .................. H01J 37/153 |

OTHER PUBLICATIONS

EP23165386.6, Extended European Search Report, Nov. 2, 2023, 13 pages.
EP23165386.6, Partial European Search Report, Jan. 8, 2023, 13 pages.

* cited by examiner

*Primary Examiner* — Jason L McCormack

(57) ABSTRACT

The beamlets in a multi-beam microscopy system are aligned based on coefficients of a fitted aberration model. In particular, an illuminator for directing the beamlets towards the sample is adjusted based on the coefficients to correct the aberrations. The coefficients are obtained based on measured beamlets' positions in the sample plane.

20 Claims, 8 Drawing Sheets

METHODS AND SYSTEMS FOR ALIGNING A MULTI-BEAM SYSTEM

FIELD OF THE INVENTION

The present description relates generally to methods for operating a multi-beam microscopy system, and more particularly, to automatically aligning the optics of the multi-beam microscopy system.

BACKGROUND OF THE INVENTION

Multi-beam scanning electron microscope (MBSEM) increases imaging throughput by simultaneously scanning a sample using multiple beamlets. The image in the MBSEM may comprise multiple cell images, wherein each cell image is formed from signals received responsive to irradiation from a single beamlet. The multiple cell images may be stitched together based on beamlets' positions to form a MBSEM image. To achieve high imaging quality, the optics for directing the multiple beamlets towards the sample need to be properly aligned to eliminate or minimize aberrations caused by the misalignment of the optics.

SUMMARY

In one embodiment, a method for aligning a multi-beam system comprises obtaining measured positions of multiple beamlets at a sample plane; obtaining virtual object positions of the multiple beamlets; determining one or more coefficients of an aberration model based on the measured positions of the multiple beamlets and the virtual object positions of the multiple beamlets; and adjusting an illuminator for directing the multiple beamlets towards the sample plane based on the determined coefficients. In this way, the aberrations caused by the illuminator of the multi-beam system can be eliminated or reduced during system calibration or a sample imaging session.

In another embodiment, a multi-beam system comprises a source for generating multiple beamlets; an illuminator for directing the multiple beamlets towards a sample positioned in the sample plane; and a controller including a processor and a memory for storing computer readable instructions, by executing the instructions in the processor, the microscopy system is configured to: access positions of a subset of the multiple beamlets at the sample plane; obtain virtual object positions of the subset of the multiple beamlets; determine one or more coefficients of an aberration model based on the measured positions and the virtual object positions of the subset of the multiple beamlets; and adjust the illuminator based on the determined coefficients.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

Like reference numerals refer to corresponding parts throughout the several views of the drawings.

DETAILED DESCRIPTION

Figure 1:
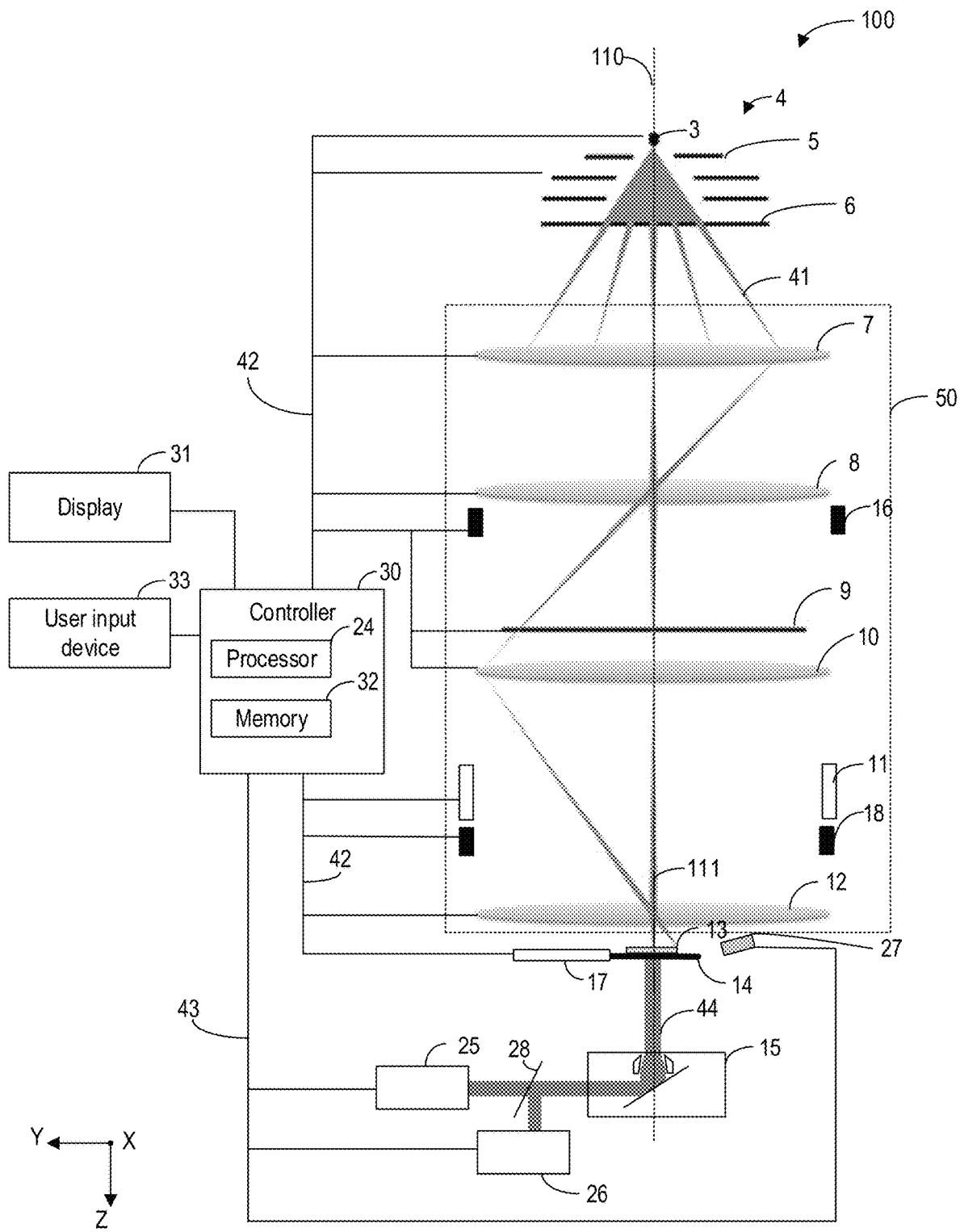
FIG. 1 shows an example multi-beam scanning electron microscope.
Figure 2:
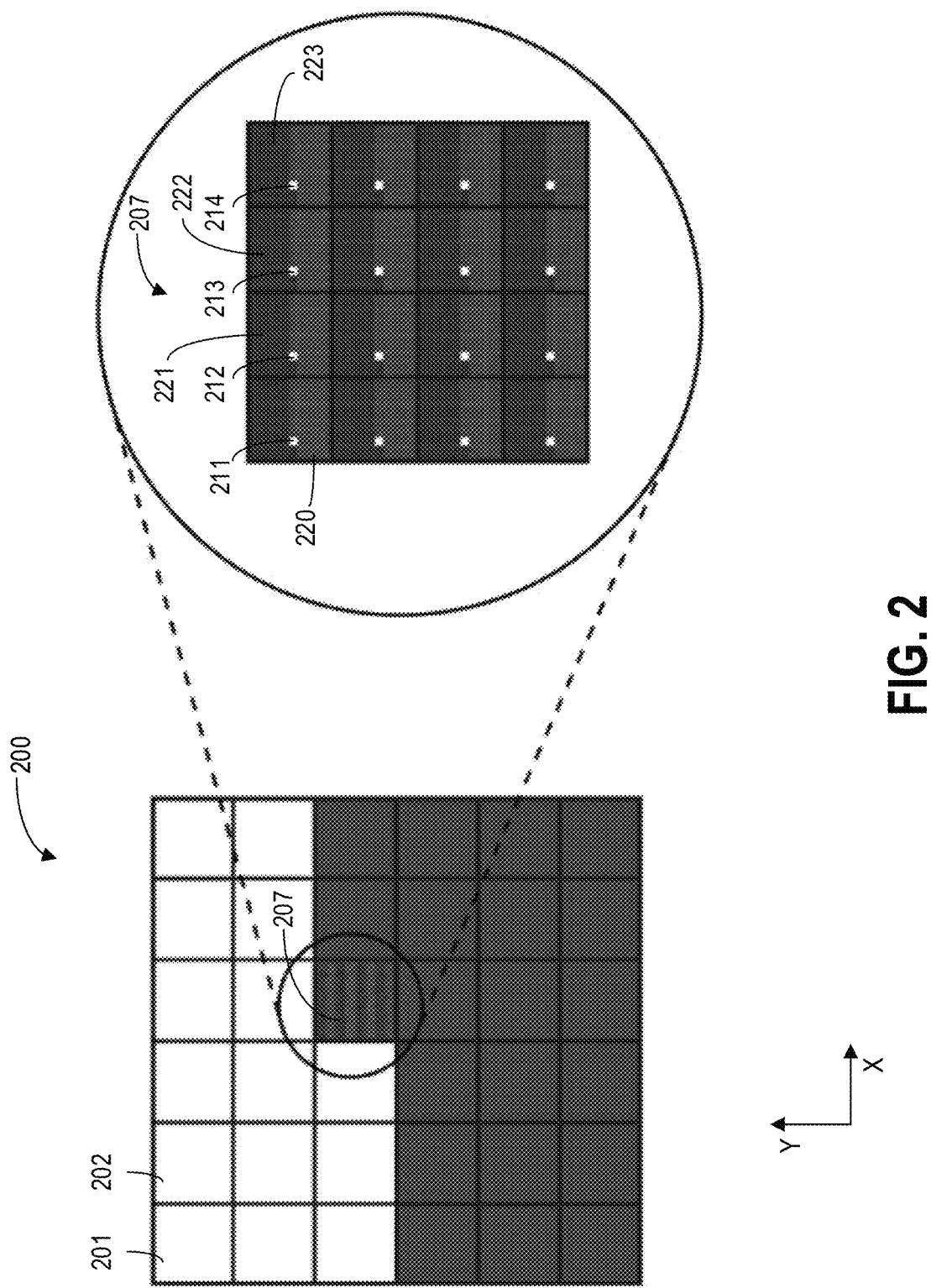
FIG. 2 illustrates an example image acquisition process for a multi-beam microscopy system.

The following description relates to systems and methods for aligning the optics of a multi-beam microscopy system (MBSEM), such as aligning an illuminator for directing the beamlets to the sample in a multi-beam scanning electron microscopy system shown in FIG. 1. The MBSEM provides high throughput sample images by simultaneously scanning a sample with multiple beamlets. The MBSEM may acquire sample images in either the transmission or reflection mode. The beamlets may simultaneously irradiate a sample with similar incident angle. That is, the beamlets are substantially parallel to each other at a sample plane. Each beamlet corresponds to a different beamlet position at the sample plane. The beamlets scan a sample region by actuating one or more deflectors. As shown in FIG. 2, each beamlet scans a different portion of the sample region and a cell image corresponding to the beamlet is acquired. The scan range of each beamlet may be determined based on the beamlets' positions at the sample plane. For example, the scan range is not less than the distance between adjacent beamlets at the sample plane, so that the entire sample region is scanned by the beamlets. The cell images may be combined, for example by stitching, to form a field image. In order to cover a large region of interest (ROI) of the sample, after acquiring data for a field image, the sample may be translated relative to the beamlets, and another sample region is imaged. The field images may be combined, for example by stitching, to cover the large ROI.

Figure 6A:
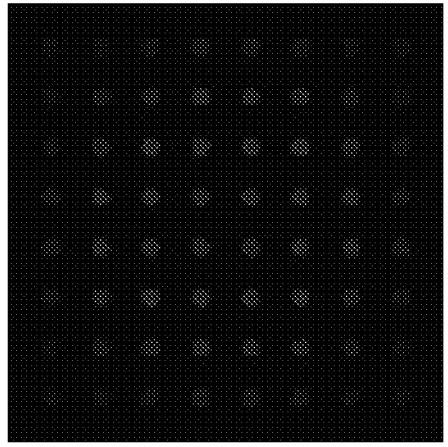
FIGS. 6A, 6B, 6C, and 6D show beamlets' positions under various types of aberrations.
Figure 6B:
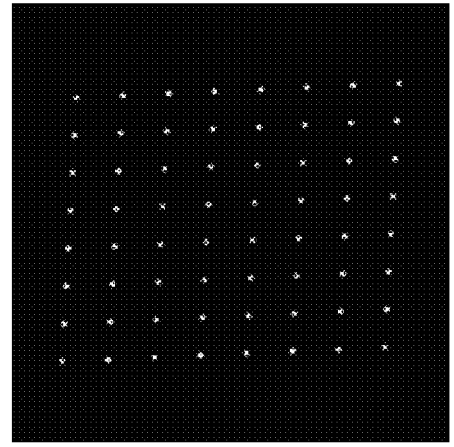
Figure 6C:
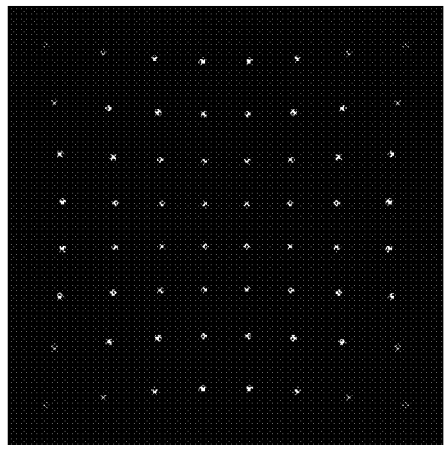
Figure 6D:
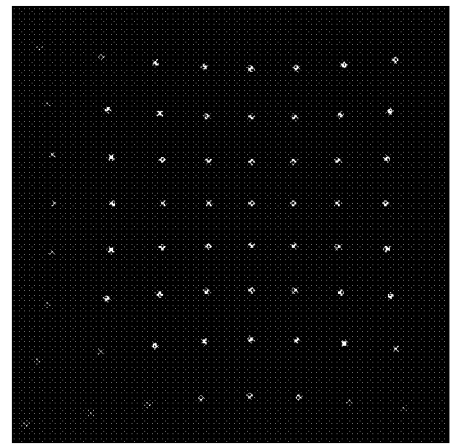

In order to achieve the high throughput of the MBSEM system, most of the time, no manual corrections are permitted within the acquisition routine, while the sample is scanned by the beamlets. However, scanning over the large ROI can lead to various disturbances of the electron beam such as defocus or astigmatism appearing during the acquisition. No correction to the electron beam column could lead to a loss of image quality in some parts of the sample image. As an example, FIGS. 6A, 6B, 6C, and 6D show beamlet's positions at the sample plane when various types of aberrations are present in the illuminator. Specifically, FIG. 6A demonstrates defocus; FIG. 6B demonstrates astigmatism; FIG. 6C demonstrates spherical aberration; and FIG. 6D demonstrates lens misalignment. These aberrations cause the beamlets deviating from their expected square grid arrangement.

In order to address the above issues, methods for aligning the optics in a multi-beam microscopy system are disclosed herein. In particular, an illuminator for directing the beamlets from a source to the sample is adjusted before and/or during image acquisition to correct the aberrations. One or more optical parts of the illuminator may be adjusted/aligned based on coefficients of an aberration model determined based on the actual positions of the multiple beamlets at the sample plane. In this way, aberrations may be automatically detected and corrected, and high-quality sample images covering a large ROI can be acquired without manual system adjustment.

The positions of the beamlets at the sample plane of the multi-beam microscopy system may be measured in multiple ways. In one embodiment, the microscopy system includes a diagnostic camera for directly imaging the beamlets' positions at the sample plane. For example, in the MBSEM system shown in FIG. 1, when beamlets are directed to the sample plane, spots of the beamlets on a scintillator positioned directed under the sample may be captured by a diagnostic camera. In another embodiment, beamlets' positions are measured by integrating signals received while scanning a small feature with the beamlets. The small feature may be a hole on a uniform background. In yet another embodiment, the beamlets' positions are measured as described in U.S. patent application Ser. No. 17/561,554, by Stopka et al., which is incorporated by reference herein in its entirety and for all purposes, wherein the beamlets' positions are determined based on the displacements of two cell images. The two cell images include overlapped sample region and are acquired before and after shifting the beamlets relative to the sample.

Figure 3:
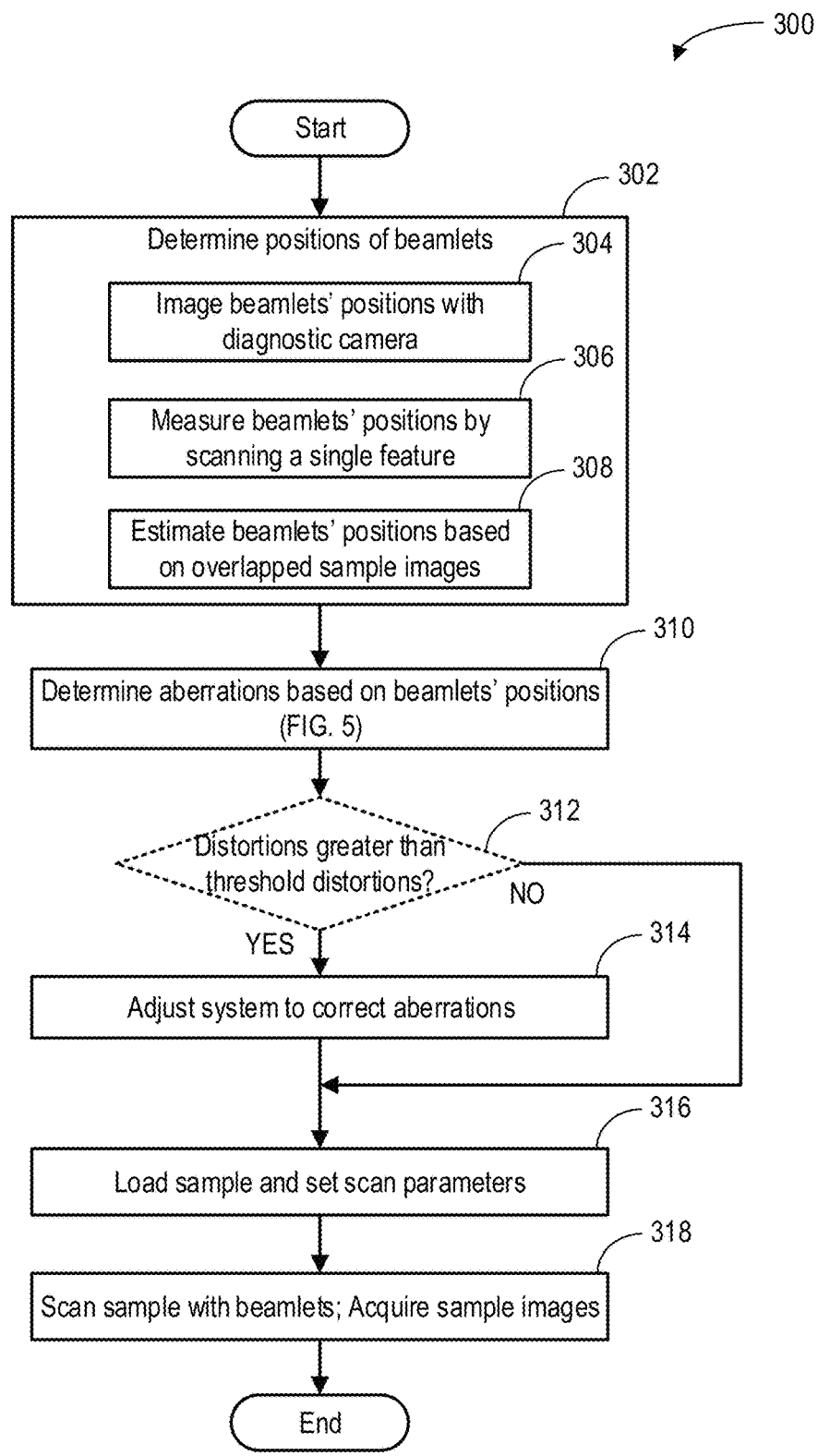
FIG. 3 shows a method for aligning the multi-beam microscopy system.
Figure 4:
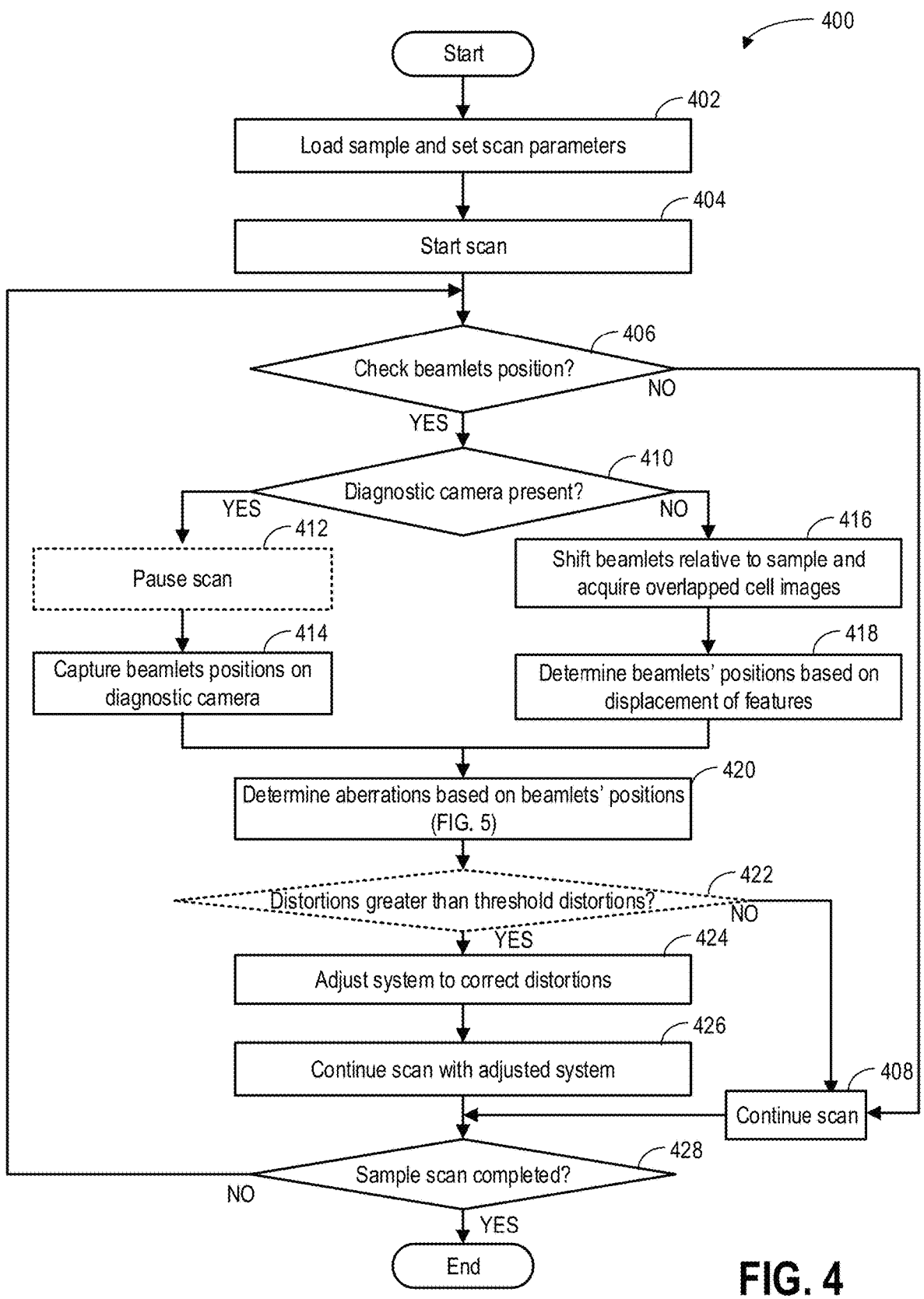
FIG. 4 shows another method for aligning the multi-beam microscopy system.

In one example, as shown in FIG. 3, the beamlets' positions are determined before imaging the sample of interest. The microscopy system is calibrated based on aberration determined based on the beamlets' positions with or without a reference sample. In another example, as shown in FIG. 4, the beamlets' positions are determined while scanning the sample, for example by using the diagnostic camera or based on overlapped cell images. Aberrations introduced by the illuminator may then be adjusted while acquiring the sample data. In yet another example, the microscopy system may be aligned both before and during the sample data acquisition routine.

The aberrations may be determined by fitting an aberration model with the measured beamlets' positions. The order of the terms in the aberration model depends on the types of aberrations that are targeted to be corrected. For example, the aberration model may include the first, second and third order terms to correct aberrations including defocus, linear distortion, lens misalignment, and spherical aberration. Each term in the aberration model includes a coefficient corresponding to the degree of a specific type of aberration. By fitting the aberration model, the coefficients are determined. Hardware related to the type of aberration in the illuminator may be adjusted based on the corresponding coefficient to reduce or eliminate a specific type of aberration.

Figure 7:
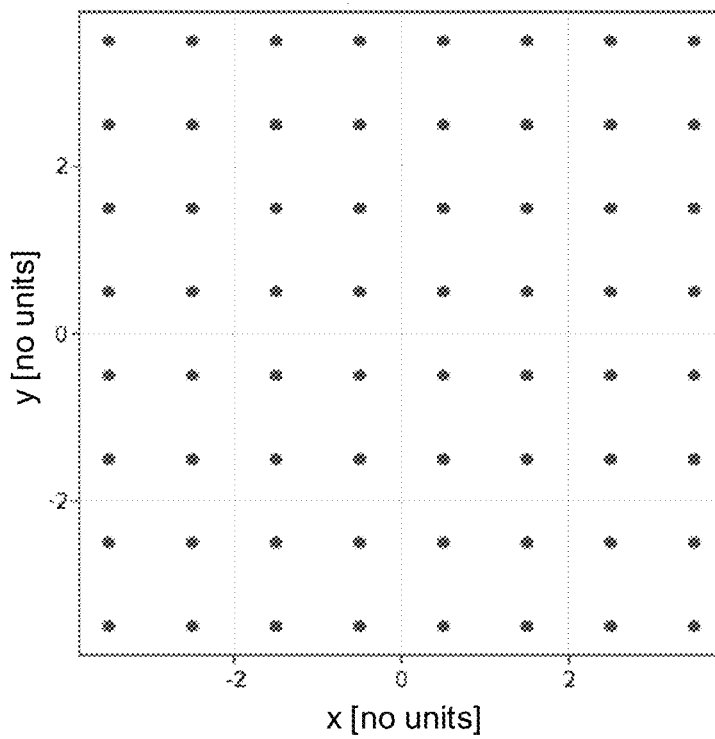
FIG. 7 shows one example of virtual object positions.

The coefficients of the aberration model are determined based on the measured beamlets' positions and virtual object positions. The virtual object positions are the positions of a virtual object in the sample plane as seen from a plane just below an aperture lens array in the source module of the microscope. The aperture lens array splits the beam generated from a source into multiple beamlets. The virtual object positions may be determined based on the known beamlets arrangement or the configuration of the aperture lens array. In one example, the virtual object positions are represented according to a specific coordinate system, such as the coordinates of the microscopy system. In another example, the virtual object positions are represented as unitless points arranged according to the configuration of the aperture array. FIG. 7 shows an example of the virtual object positions of 8 by 8 beamlets, which are regularly spaced in a square grid arrangement.

Figure 8:
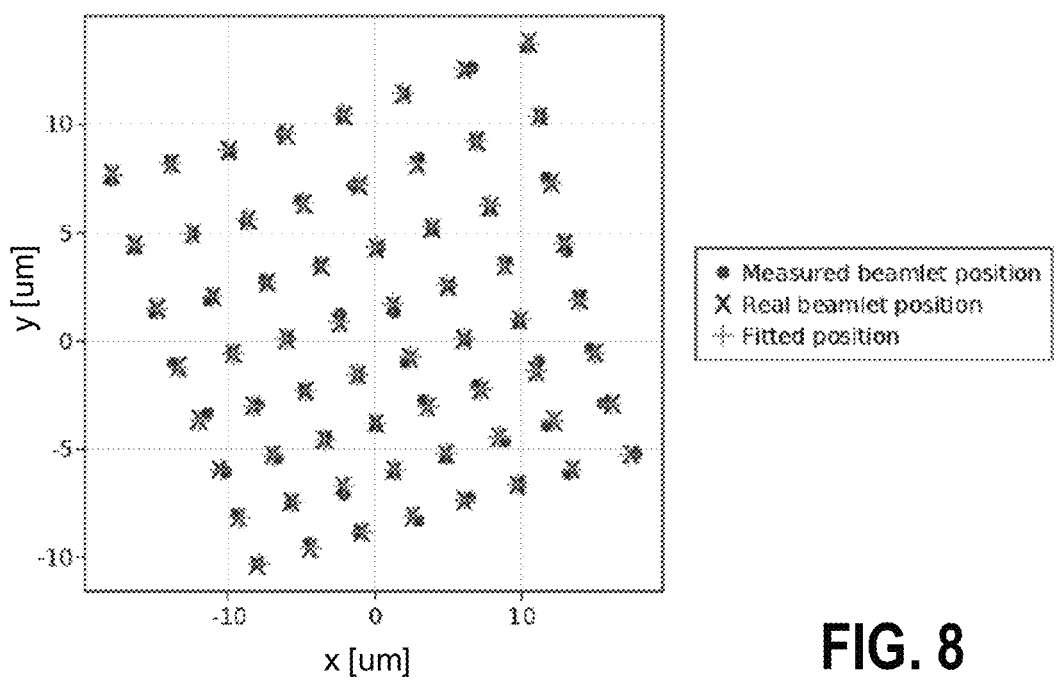
FIG. 8 shows beamlets' positions from a simulation for investigating the effect of errors in measured beamlets' positions on the aberration estimation.
Figure 9:
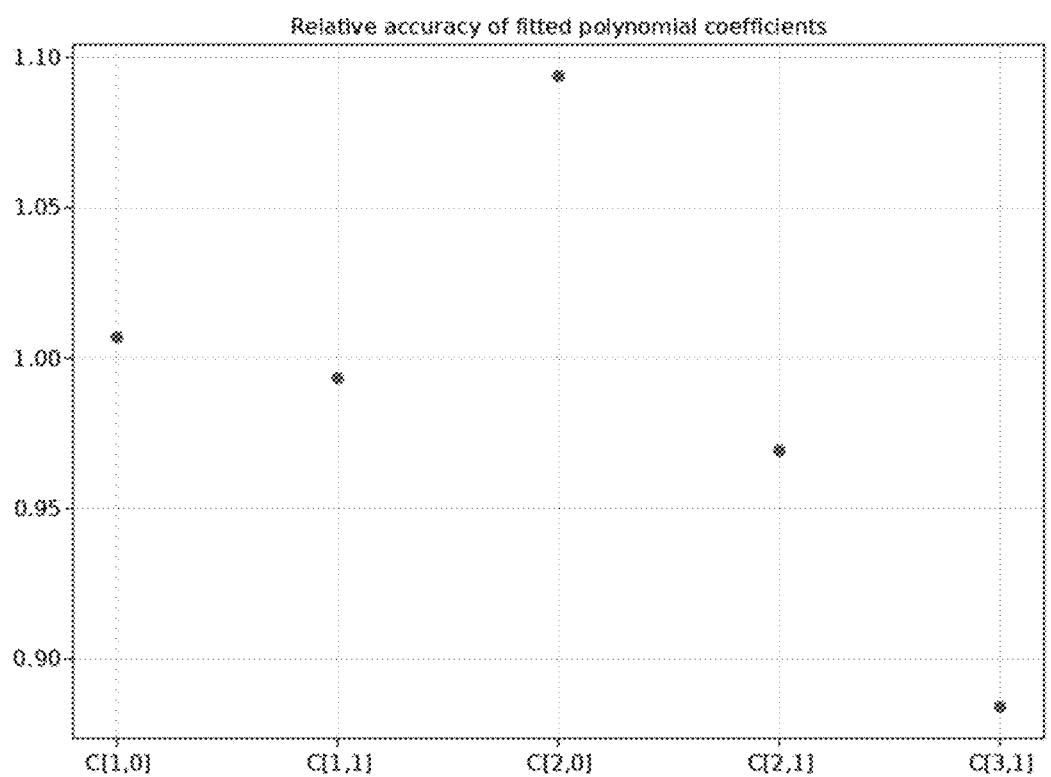
FIG. 9 shows accuracies of the fitted coefficients in the simulation of FIG. 8.

In order to determine each coefficient in the aberration model, the number of the beamlets of which the positions are measured has to be larger than the number of the unknown coefficients. Most of the time, the number of the beamlets in a multi-beam microscopy system is much larger than the number of coefficients. The large number of beamlets allows the coefficients of the aberration model to be accurately determined despite error in measuring the beamlets' positions, as indicated in FIGS. 8-9. For this reason, it is possible to align the microscope with positions of a subset of the beamlets of the microscopy system.

Turning to FIG. 1, an example MBSEM 100 is shown. The microscope includes a vacuum enclosure (not shown) and a charged particle source module 4 for producing multiple charged particle beamlets along a primary axis 110. The charged particle source module 4 may include an electron source 3, extractor 5 and aperture lens array (ALA) 6. The multiple beamlets are directed to sample 13 along a beam axis 111 after passing an electron-optical illuminator 50. The beam axis may overlap with the primary beam axis 110, as shown in the figure. The electron-optical illuminator 50 may include multiple lenses (such as lenses 7, condenser lenses 8 and 10, and final lens 12), aperture 9, stigmators 16 and 18, and deflectors 11. The multiple beamlets may be scanned relative to beam axis 111 by sending signals to the deflectors 11. Further, the beam axis 111 may be adjusted by shifting and/or tilting relative to primary axis 110 by operating the deflectors 11. The beamlets may then be scanned relative to the adjusted beam axis.

Sample 13 is held in a sample plane with a sample holder 14 that can be positioned in multiple degrees of freedom by a sample stage 17. In one example, the sample holder 14 is a scintillator under sample 13. If sample 13 is a thin specimen, MBSEM 100 may be operated in a transmission mode, wherein charged particles transmitted through the sample may reach the scintillator and be converted to light 44. The light may be detected by camera 25 after passing the detector light optics 15. Camera 25 may include a Silicon photomultipliers (SiPMs). Sample images can be formed from signals detected by camera 25. In some embodiments, a portion of light 44 may be deflected by beam splitter 28 and detected by diagnostic camera 26 at a detection plane. In another example, MBSEM 100 operates in a reflection mode, wherein charged particles emitted from sample 13 are collected by camera 27 at a detection plane.

In some embodiments, sample holder 14 does not include a scintillator, and charged particles transmitted through sample 13 are detected by a pixelated detector for charged particles positioned downstream of the sample holder 14.

The controller 30 comprises a processor 24 and non-transitory memory 32. Computer readable instructions may be stored in the non-transitory memory 32, when being executed by the processor, causes the microscopy system to perform the methods disclosed herein. The controller may provide a variety of functions, such as synchronizing actions, providing setpoints, processing signals, performing calculations, receiving operator input from user input device 33 and displaying messages/information on display device 31. The controller 30 communicates with various illustrated components via control lines 42. For example, controller 30 may be configured to adjust beam parameters including beam current by communicating to the charged particle source 4. The controller 30 may be configured to adjust scanning parameters including one or more of the scanning pattern, dwell time, and scanning range of each beamlet by adjusting the deflectors 11. The controller 30 may be configured to position the sample and translate the sample relative to the primary axis 110 by actuating the sample stage 17. The controller may adjust beamlets' positions on sample 13 by actuating one or more optical components of the electron-optical illuminator. Further, controller 30 receives signals detected by one or more cameras 25, 26 and 27 via data bus 43, processes the signals and generates images based on the processed signal, for example, on display 31.

In some embodiment, the charged particle microscope may operate in the reflection mode only, wherein charged particles emitted from the sample may be acquired from detectors above the sample plane and there is no diagnostic camera for imaging the beamlets' positions. Such microscope may be used for imaging thick samples wherein the charged particles cannot transmit through the sample. In other embodiments, the multi-beam microscope may have a source other than a charged particle source. For example, the source may be a light or an X-ray source.

FIG. 2 illustrates a sample 200 imaged by a MBSEM. Each grid in sample 200 corresponds to a sample region imaged in a field image. The field images are acquired sequentially by translating the sample relative to the multiple beamlets. For example, after scanning sample region 201 for a first field image, the sample is translated by actuating the sample stage, and sample region 202 is scanned for a second field image. In this example, each field image includes 4×4 cell images. Each cell image is acquired by scanning the 4×4 beamlets according to a scanning pattern (such as zig-zag). In the zoomed-in sample region 207, the beam locations (such as beam locations 211-214) during a scan for generating cell images are shown. Each cell image in a field image corresponds to a beamlet. For example, the cell image acquired from sample portion 220 corresponds to a first beamlet, and the cell image acquired from sample portion 221 corresponds to a second beamlet, adjacent to the first beamlet. Sample image covering the sample 200 may be generated by stitching the field images based on the amount of sample translation. Each field image may be generated by stitching the cell images based on the beamlets' positions relative to each other.

FIG. 3 shows method 300 for aligning a multi-beam microscopy system. The microscopy system is aligned before performing sample imaging. One or more optical parts in the illuminator are adjusted based on beamlets' positions measured with or without a reference sample.

Figure 10:
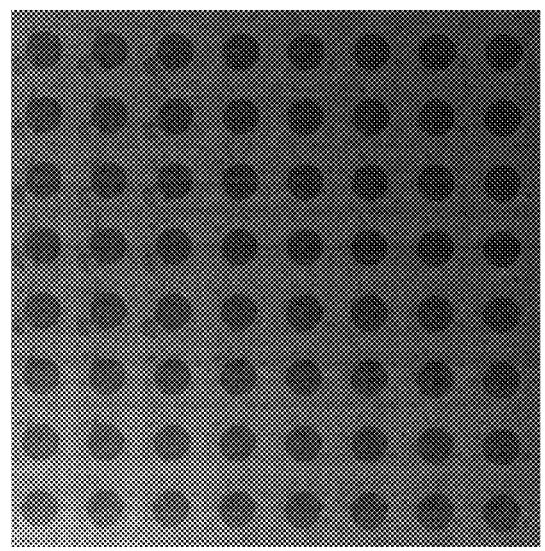
FIG. 10 is an example of integrated image for measuring beamlets' positions.

At 302, positions of the multiple beamlets at the sample plane are determined. Based on the system and the availability of a reference sample, different approaches may be taken to measure the current beamlets' positions. In one embodiment, if the system includes a diagnostic camera, such as the diagnostic camera 26 in FIG. 1, at 304, the beamlets' positions may be directly imaged using the diagnostic camera. For example, the beamlets are directed towards the sample plane. Each beamlet hit a different spot on the scintillator located at the sample plane, and light generated from the scintillator are collected by the diagnostic camera. The beamlets' positions can be determined directly from the beam spots in the image captured by the diagnostic camera. The reference sample is optional for measuring beamlets' positions using the diagnostic camera. In another embodiment, at 306, the beamlets' positions may be determined by scanning a reference sample including a single feature in the sample plane with the beamlets, and integrating signals emitted from the sample. The single feature is a feature on a uniform background, and the feature is covered by the scanning range of one beamlet. For example, the reference sample includes a small hole on a featureless background. The small hole has a diameter comparable to the pitch of the beamlet pattern in the sample plane. In one example, the small hole has a diameter less than the pitch of the beamlet pattern in the sample plane. The beamlets are scanned over a region larger than the size of the beamlets' pattern in the sample plane. As the beamlets scanning over the reference sample, signals from the reference sample are detected using a location resolved detector, such as detector 25 in FIG. 1. The detected signals are integrated over time and used for forming an integrated image showing beamlets' positions. An example of the integrated image acquired using 8×8 beamlets is shown in FIG. 10. The beamlets' positions can be directly extracted from the integrated image by locating the center of each beamlet's spot. In yet another embodiment, at 308, the beamlets' positions are determined based on the displacement of each beamlet in two overlapped cell images, as described in U.S. patent application Ser. No. 17/561,554. The sample may be a reference sample or the sample under investigation. In particular, after acquiring a first cell image by scanning the beamlets over a sample region, the beamlets are shifted relative to the sample. The second cell image overlapping with the first cell image is then acquired. The beamlets' positions may be estimated based on the displacement of the same feature imaged by the same beamlet in the two cell images.

In some examples, positions of a subset of the beamlets generated by the source module are measured, and the positions of all beamlets are determined by interpolating measured positions of a subset of the beamlets. This may happen when positions of one or more beamlets cannot be determined or determined accurately. For example, positions of beamlets on the edge of the beamlets' pattern cannot be determined if the signal from these beamlets are out of the diagnostic camera's field of view. In another example, one or more beamlets' positions cannot be accurately determined if the signal collected from these beamlets are low, such as due to lack of feature in some sample areas.

At 310, the aberrations are determined based on the beamlet's positions determined at 302. As described in detail in FIG. 5, coefficients in an aberration model are determined by fitting the model with the virtual object positions and the beamlets' positions. Each type of aberration corresponds to specific coefficients of the aberration model.

Figure 5:
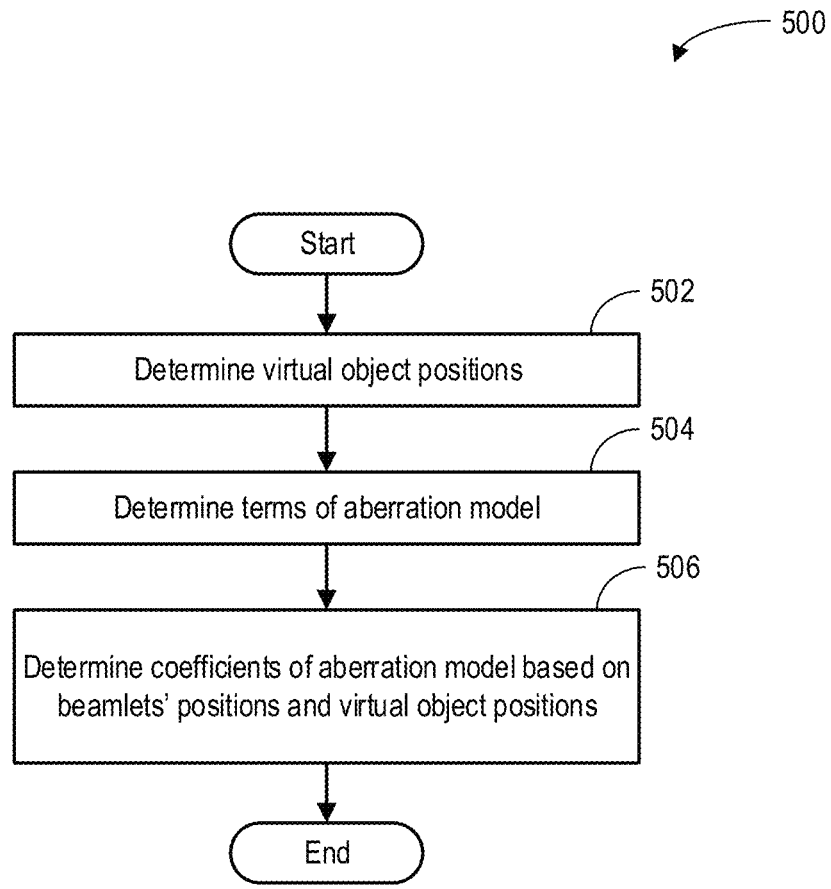
FIG. 5 shows a method for determining aberration of the multi-beam microscopy system.

FIG. 5 shows method 500 for determining aberrations based on the measured beamlets' positions.

At 502, virtual object positions of the microscopy system are obtained. The virtual object positions are the positions of a virtual object as seen from a plane just below the aperture lens array in the source module. The virtual object positions may be determined based on the known arrangement of the beamlets from the source module. For example, for a multi-beam system with 8×8 beamlets arranged in a square format/arrangement, the virtual object positions are shown in FIG. 7, wherein the virtual object positions are marked as dots. Each dot corresponds to one beamlet. The virtual object positions may be expressed as $w_o = x + iy$, with $x,y \in \{-3.5, -2.5, -1.5, -0.5, 0.5, 1.5, 2.5, 3.5\}$.

At 504, the terms or orders of terms of the aberration model are determined. The terms in the aberration model may be determined based on the known type of aberrations in the system, or the particular use case.

In one example, the aberration model for each beamlet may be expressed as:

$$w_i = C_{0,0} + C_{1,0}w_o + C_{1,1}\overline{w_o} + C_{2,0}w_o^2 + C_{2,1}w_o\overline{w_o} + C_{3,1}w_o^2\overline{w_o},$$ Equation 1 wherein $w_o$ is the object position, $w_i$ is the beamlet's position in the image plane, and $C_{0,0}$, $C_{1,0}$, $C_{1,1}$, $C_{2,0}$, $C_{2,1}$, and $C_{3,1}$ are coefficients of the terms of the aberration model. Each coefficient corresponds to one term, which relates to a specific type of aberration. Herein, coefficient $C_{0,0}$ corresponds to the offset of the beamlets' pattern's center. Coefficient $C_{1,0}$ of the first order term $w_o$ corresponds to defocus/magnification, which represents the size of the pattern compared to the object. The defocus can be reflected in the change of pitch between beamlets shown in FIG. 6A. Coefficient $C_{1,1}$ of the first order term $\overline{w_o}$ corresponds to linear distortion, which links to linear astigmatism. The linear astigmatism can be reflected in the shear/stretch of the beamlets positions shown in FIG. 6B. Coefficients $C_{2,0}$ and $C_{2,1}$ of the second order terms $w_o^2$ and $w_o\overline{w_o}$, correspond to the center of the spherical aberration that related to the lens misalignment shown in FIG. 6D. Coefficient $C_{3,1}$ of the third order term $w_o^2\overline{w_o}$ relates to spherical aberration. Based on the aberration of the system, one or more terms in Equation 1 may be omitted. In some examples, higher order terms may be added to Equation 1.

At 506, the coefficients of the aberration model are determined by fitting the model determined at 504 with the beamlets' positions and the virtual object positions. For example, for the 8×8 beamlets, the 64 virtual object positions may be expressed as $w_{o,1}, w_{o,2}, \ldots w_{o,64}$. The 64 beamlets' positions may be expressed as $w_{i,1}, w_{i,2}, \ldots w_{i,64}$. The aberration model in Equation 1 may be expressed as following for the 64 beamlets:

$$\begin{pmatrix} w_{i,1} \\ w_{i,2} \\ \vdots \\ w_{i,64} \end{pmatrix} = \begin{pmatrix} 1 & w_{o,1} & \overline{w_{o,1}} & w_{o,1}^2 & w_{o,1}\overline{w_{o,1}} & w_{o,1}^2\overline{w_{o,1}} \\ 1 & w_{o,2} & \overline{w_{o,2}} & w_{o,2}^2 & w_{o,2}\overline{w_{o,2}} & w_{o,2}^2\overline{w_{o,2}} \\ \vdots & & & & & \vdots \\ 1 & w_{o,64} & \overline{w_{o,64}} & w_{o,64}^2 & w_{o,64}\overline{w_{o,64}} & w_{o,64}^2\overline{w_{o,64}} \end{pmatrix} \cdot \begin{pmatrix} C_{0,0} \\ C_{1,0} \\ C_{1,1} \\ C_{2,0} \\ C_{2,1} \\ C_{3,1} \end{pmatrix}$$ Equation 2

Equation 2 can also be expressed in short as:

$$W = M \cdot C,$$ Equation 3 wherein W is a vector including beamlets' positions; M is the matrix formed by known virtual object positions; and C is a vector of unknown coefficients. We can invert the relationship to C=M/W, and determine the coefficients using regression analysis, such as least square fitting.

In some embodiments, positions of a subset of the beamlets are used for determining the coefficients. For example, only beamlets of which the positions can be accurately determined are used for calculating the coefficients.

Because the number of the beamlets' positions in W is more than the number of the unknown coefficients in C, the coefficients can be determined accurately despite errors in the measurement of beamlets' positions. FIG. 8 shows a simulation that demonstrates this advantage. For 8×8 beamlets, uncertainties or errors were artificially added to the real beamlets' positions to obtain the measured beamlets' position. The measured beamlets' positions were used for fitting the coefficients of the aberration model shown in Equation 2. The fitted beamlets' positions were calculated from the fitted aberration model. The fitted beamlets' positions are very close to the real positions despite the artificially introduced measurement error. FIG. 9 shows the accuracy of the coefficients for the first to third order terms in the fitted aberration model comparing to the actual coefficients. X axis shows the coefficients $C_{1,0}$, $C_{1,1}$, $C_{2,0}$, $C_{2,1}$, and $C_{3,1}$ in Equation 2. The closer the accuracy to 1 in the Y axis, the more accurate is the coefficient to the actual coefficient. FIGS. 8-9 show that even though the measured beamlets' positions differ from the real beamlets' positions substantially, this difference does not affect the accuracy of the polynomial fit for the aberration model.

Turning back to FIG. 3, at 312, method 300 optionally checks whether the distortions by the aberrations are greater than the threshold distortions. The distortion caused by each type of aberrations may be checked to determine which type aberration to correct at 314. The amount of the distortion may be determined based on the coefficients determined at 310. For example, if the coefficient of a particular term of the aberration model deviates from an expected coefficient by a certain percentage, such as 10%, the distortion of the corresponding aberration type is corrected at 314. In another example, instead of comparing with the expected coefficient, the current coefficient may be compared with a previously estimated coefficient. If the distortions are greater than the threshold distortions at 312, the system is adjusted to reduce the distortions due to aberration at 314. Otherwise, method 300 moves to 316.

In some embodiment, checking the amount of the distortions at 312 includes comparing the beamlets' positions with previous or expected beamlets' positions to determine the presence of aberration. For example, the amount of the distortion can be estimated with the change of the beamlets' positions from expected beamlets' positions. In some example, the amount of distortion may be compared with the threshold distortion before determining the aberrations based on the beamlets' positions.

At 314, one or more parts of the illuminator of the microscope are adjusted based on the type of aberration to be corrected and the values of the corresponding coefficients. For example, the final lens (such as lens 12 in FIG. 1) may be adjusted based on the coefficient of the first order term (such as $C_{1,0}$) for correcting the magnification/defocus. By correcting the defocus, pattern pitch among the beamlets remains the same. One or more of the stigmators may be adjusted based on the coefficient of the first order term (such as $C_{1,1}$) for correcting the astigmatism and the linear distortion (anamorphosis). The stigmators may be adjusted to maintain square grid pattern of the beamlets. The deflectors may be adjusted based on the coefficients of the second order terms (such as $C_{2,0}$ and $C_{2,1}$) for correcting the center of the spherical aberration that related to lens misalignment. The deflectors may be adjusted to center the beamlets onto the objective lenses. The condenser lenses and the final lens (such as condenser lenses 8, 10, and 12 in FIG. 1) may be adjusted based on the coefficient of the third order term (such as $C_{3,1}$) for correcting the third order distortion due to spherical aberration and the position of the last common crossover of the beamlets with respect to the final lens. The condenser lenses may be calibrated to align the beamlets correctly with respect to the objective main plane in order to minimize distortions and/or optimize achievable resolution of the off-axial beamlets. Adjusting the lenses includes adjusting the excitations to the lenses.

In some embodiment, after adjusting the illuminator, the beamlets' positions may be checked again to confirm that the aberrations have been successfully corrected. The beamlets' positions may be checked using the same or different method as used in step 302.

At 316, the sample under investigation is loaded into the microscope and parameters for imaging the sample are set. The parameters may include one or more of the beam current, scanning pattern, scanning range of each beamlet, and dwell time.

At 318, the sample is scanned with the beamlets, according to the image parameters, to obtain the sample images. In some examples, the aberration may be checked periodically while acquiring sample data as shown in FIG. 4.

In this way, the aberrations may be determined with high accuracy and the beamlets can be aligned automatically based on the determined aberrations before or during sample data acquisition.

FIG. 4 shows method 400 for aligning beamlets during sample data acquisition. Beamlets' positions are determined while scanning the sample under investigation, with the sample positioned in the sample plane. The beamlets' positions may be checked periodically to detect and correct the aberrations.

At 402, the sample is loaded into the vacuum chamber and positioned in the sample plane. Further, scan parameters including one or more of the scanning pattern, beam current, scanning range of the beamlet, and the dwell time are set. The sample may also be imaged at low resolution to identify the region of interest.

At 404, the beamlets are directed towards the sample, and one or more type of emissions from the sample are captured by various detectors.

At 406, method 400 determines whether the beamlets' positions need to be checked, or whether the optics of the system need to be aligned. In one example, the beamlets' positions may be checked after a predetermined time period. If it is determined to check the beamlets' positions, method 400 moves to 410. Otherwise, scan continues with current setting of the illuminator at 408.

At 410, method 400 checks whether a diagnostic camera for directly imaging the beamlets' positions exists in the microscope. If the answer is YES, the beamlets' scan may optionally be paused at 412, and an image showing the beamlets' positions is captured by the diagnostic camera at 414. If there is no diagnostic camera available, the beamlets' positions may be estimated using a method similar to 308 of FIG. 3. For example, at 416, after acquiring a first cell image, the beamlets are shifted relative to the sample for a small distance (less than the scanning range of each beamlet), and a second cell image is acquired. The first and second cell images cover an overlapped sample region. The beamlets may be shifted back to their previous positions and continuing scanning the sample after the overlapped cell images are acquired. At 418, the beamlets' positions are determined based on the displacement of the same feature in the overlapped sample region in the two cell images. In some examples, when the sample has featureless regions, positions of some of the beamlets may not able to be determined, and positions of only a subset of the beamlets can be reliably determined.

At 420, as presented in FIG. 5, coefficients of the aberration model are determined based on positions of all or a subset of the beamlets.

At 422, similar to 312 of FIG. 3, method 400 optionally checks whether the distortions caused by the aberration are greater than threshold distortions. The amount of the distortions may be determined based on the value of the coefficients determined at 420, or the changes of the coefficients. In some embodiment, the distortion may be evaluated by the change in beamlets' positions from expected positions or previously measured positions. If the distortions are below the threshold, the sample scan is continued without interruption at 408. Otherwise, the distortions are corrected at 424.

In some embodiment, the distortions may be checked by comparing the measured beamlets' positions with expected/previously measured positions before fitting the aberration model at 420. If there is no large deviation from the expected/previous measured beamlets' positions, the sample scan continues at 408. Otherwise, the coefficients of the aberration model are determined and the system is adjusted accordingly.

At 424, similar to 314 of FIG. 3, the microscopy system, such as the illuminator of the system, is adjusted based on the coefficients determined at 420. At 426, the sample is imaged with the adjusted system.

At 428, method 400 checks whether the sample scan is completed. If the answer is YES, method 400 exits. Otherwise, the scan and data acquisition continue.

In this way, the aberration may be monitored and corrected while imaging the sample. This ensures that high quality sample data are acquired with little or no effect to the data acquisition time.

The technical effect of measuring the positions of multiple beamlets is to monitor the aberration and determine the coefficients of the aberration model. The technical effect of determining the coefficients of the aberration model is to identify the components in the illuminator that need to be adjusted for correcting the corresponding type of aberration.

Clause 1. A method for aligning a multi-beam system, comprising: obtaining measured positions of multiple beamlets at a sample plane; obtaining virtual object positions of the multiple beamlets; determining one or more coefficients of an aberration model based on the measured positions of the multiple beamlets and the virtual object positions of the multiple beamlets; and adjusting an illuminator for directing the multiple beamlets towards the sample plane based on the determined coefficients.

Clause 2. The method of clause 1, further comprising: determining a number of the coefficients of the aberration model; and determining the coefficients by fitting the aberration model using the measured positions of the multiple beamlets and the virtual object positions of the multiple beamlets.

Clause 3. The method of clause 2, wherein adjusting the illuminator includes adjusting one or more components of the illuminator based on the coefficients of a corresponding order of terms in the aberration model.

Clause 4. The method of clause 3, wherein the one or more components includes a stigmator, a lens, and a deflector of the illuminator.

Clause 5. The method of any of clauses 1-4, wherein the number of the multiple beamlets is greater than the number of the one or more coefficients of the aberration model.

Clause 6. The method of any of clauses 1-5, wherein obtaining the virtual object positions of the multiple beamlets includes determining the virtual object positions based on a configuration of a source for generating the multiple beamlets.

Clause 7. The method of any of clauses 1-5, wherein obtaining the virtual object positions includes setting the virtual object positions in a square grid pattern.

Clause 8. The method of any of clauses 1-7, wherein obtaining measured positions of the multiple beamlets at the sample plane includes measuring the positions of the multiple beamlets at the sample plane using a diagnostic camera.

Clause 9. The method of any of clauses 1-7, wherein obtaining measured positions of the multiple beamlets at the sample plane includes estimating the positions of the multiple beamlets at the sample plane based on at least two sample images with overlapped sample area.

Clause 10. The method of any of clauses 1-7, wherein obtaining measured positions of the multiple beamlets at the sample plane includes measuring the positions of the multiple beamlets at the sample plane by scanning a reference sample with a single feature using the multiple beams.

Clause 11. The method of any of clauses 1-10, further comprising: after aligning the illuminator, scanning the multiple beamlets over a sample positioned in the sample plane and generating a sample image.

Clause 12, a multi-beam microscopy system, comprising: a source for generating multiple beamlets; an illuminator for directing the multiple beamlets towards a sample positioned in the sample plane; and a controller including a processor and a memory for storing computer readable instructions, by executing the instructions in the processor, the microscopy system is configured to: access positions of a subset of the multiple beamlets at the sample plane; obtain virtual object positions of the subset of the multiple beamlets; determine one or more coefficients of an aberration model based on the measured positions and the virtual object positions of the subset of the multiple beamlets; and adjust the illuminator based on the determined coefficients.

Clause 13. The system of clause 12, wherein a number of the subset of the multiple beamlets is greater than the number of coefficients of the aberration model.

Clause 14. The system of any of clauses 12-13, wherein the source is an electron source.

Clause 15. The system of any of clauses claim 12-14, wherein the microscopy system is further configured to: scanning at least the beamlets over a sample positioned in the sample plane and collect a first sample image of a first sample region with the detector; and scanning at least the beamlets over the sample and collect a second sample image of a second sample region with the detector, wherein the first sample region overlaps the second sample region, and wherein measure positions of the subset of the multiple beamlets includes determine the positions of the subset of the multiple beamlets based on the first sample image and the second sample image.

Clause 16. The system of clause 15, wherein the microscopy system is further configured to: after adjusting the illuminator, scanning the multiple beamlets over the sample; and generate a third sample image based on signals received by the detector.

Clause 17. The system of any of clauses 12-16, wherein the detector includes a diagnostic camera for collecting images of the multiple beamlets at the sample plane.

Clause 18. The system of clause 17, further comprising a second detector for collecting emissions from a sample positioned at the sample plane, wherein the system is further configured to: scan the multiple beamlets generated by the source over a sample positioned at the sample plane; collect emissions using the second detector; and generate a sample image based on the collected emissions.

Clause 19. The system of any of clauses 12-18, wherein the microscopy system is further configured to determine an order of terms of the aberration model based on the positions of the subset of the multiple beamlets at the sample plane.

Clause 20. The system of any of clauses 12-19, further includes a detector, and wherein access positions of a subset of the multiple beamlets at the sample plane includes measure positions of the subset of the multiple beamlets using the detector.

What is claimed is:

1. A method for aligning a multi-beam system, comprising:
    obtaining measured positions of multiple beamlets at a sample plane;
    obtaining virtual object positions of the multiple beamlets;
    determining one or more coefficients of an aberration model based on the measured positions of the multiple beamlets and the virtual object positions of the multiple beamlets; and
    adjusting an illuminator for directing the multiple beamlets towards the sample plane based on the determined coefficients.

2. The method of claim 1, further comprising: determining a number of the coefficients of the aberration model; and determining the coefficients by fitting the aberration model using the measured positions of the multiple beamlets and the virtual object positions of the multiple beamlets.

3. The method of claim 2, wherein adjusting the illuminator includes adjusting one or more components of the illuminator based on the coefficients of a corresponding order of terms in the aberration model.

4. The method of claim 3, wherein the one or more components includes a stigmator, a lens, and a deflector of the illuminator.

5. The method of claim 1, wherein the number of the multiple beamlets is greater than the number of the one or more coefficients of the aberration model.

6. The method of claim 1, wherein obtaining the virtual object positions of the multiple beamlets includes determining the virtual object positions based on a configuration of a source for generating the multiple beamlets.

7. The method of claim 1, wherein obtaining the virtual object positions includes setting the virtual object positions in a square pattern.

8. The method of claim 1, wherein obtaining measured positions of the multiple beamlets at the sample plane includes measuring the positions of the multiple beamlets at the sample plane using a diagnostic camera.

9. The method of claim 1, wherein obtaining measured positions of the multiple beamlets at the sample plane includes estimating the positions of the multiple beamlets at the sample plane based on at least two sample images with overlapped sample area.

10. The method of claim 1, wherein obtaining measured positions of the multiple beamlets at the sample plane includes measuring the positions of the multiple beamlets at the sample plane by scanning a reference sample with a single feature using the multiple beams.

11. The method of claim 1, further comprising: after aligning the illuminator, scanning the multiple beamlets over a sample positioned in the sample plane and generating a sample image.

12. A multi-beam microscopy system, comprising:
    a source for generating multiple beamlets;
    an illuminator for directing the multiple beamlets towards a sample positioned in the sample plane; and
    a controller including a processor and a memory for storing computer readable instructions, by executing the instructions in the processor, the microscopy system is configured to:
    access positions of a subset of the multiple beamlets at the sample plane;
    obtain virtual object positions of the subset of the multiple beamlets;

determine one or more coefficients of an aberration model based on the measured positions and the virtual object positions of the subset of the multiple beamlets; and adjust the illuminator based on the determined coefficients.

13. The system of claim 12, wherein a number of the subset of the multiple beamlets is greater than the number of coefficients of the aberration model.

14. The system of claim 12, wherein the source is an electron source.

15. The system of claim 12, wherein the microscopy system is further configured to:

scanning at least the beamlets over a sample positioned in the sample plane and collect a first sample image of a first sample region with the detector; and scanning at least the beamlets over the sample and collect a second sample image of a second sample region with the detector, wherein the first sample region overlaps the second sample region, and wherein measure positions of the subset of the multiple beamlets includes determine the positions of the subset of the multiple beamlets based on the first sample image and the second sample image.

16. The system of claim 15, wherein the microscopy system is further configured to: after adjusting the illuminator, scanning the multiple beamlets over the sample; and generate a third sample image based on signals received by the detector.

17. The system of claim 12, wherein the detector includes a diagnostic camera for collecting images of the multiple beamlets at the sample plane.

18. The system of claim 17, further comprising a second detector for collecting emissions from a sample positioned at the sample plane, wherein the system is further configured to:

scan the multiple beamlets generated by the source over a sample positioned at the sample plane;

collect emissions using the second detector; and generate a sample image based on the collected emissions.

19. The system of claim 12, wherein the microscopy system is further configured to determine an order of terms of the aberration model based on the positions of the subset of the multiple beamlets at the sample plane.

20. The system of claim 12, further includes a detector, and wherein access positions of a subset of the multiple beamlets at the sample plane includes measure positions of the subset of the multiple beamlets using the detector.

* * * * *